United States Patent
Liao et al.

(10) Patent No.: US 9,461,198 B2
(45) Date of Patent: *Oct. 4, 2016

(54) BACKSIDE TRANSPARENT SUBSTRATE ROUGHENING FOR UV LIGHT EMITTING DIODE

(71) Applicant: RayVio Corporation, Hayward, CA (US)

(72) Inventors: Yitao Liao, Emerald Hills, CA (US); Douglas A. Collins, Cambridge, MA (US)

(73) Assignee: RAYVIO CORPORATION, Hayward, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/796,763

(22) Filed: Jul. 10, 2015

(65) Prior Publication Data

US 2015/0318434 A1    Nov. 5, 2015

Related U.S. Application Data

(63) Continuation of application No. 14/194,425, filed on Feb. 28, 2014, now Pat. No. 9,112,103.

(60) Provisional application No. 61/776,760, filed on Mar. 11, 2013.

(51) Int. Cl.
*H01L 21/00* (2006.01)
*H01L 33/00* (2010.01)
(Continued)

(52) U.S. Cl.
CPC ......... *H01L 33/0075* (2013.01); *H01L 33/007* (2013.01); *H01L 33/0025* (2013.01); *H01L 33/06* (2013.01); *H01L 33/325* (2013.01); *H01L 33/58* (2013.01); *H01L 33/20* (2013.01)

(58) Field of Classification Search
CPC ..... H01L 29/30; H01L 33/002; H01L 33/12; H01L 33/18; H01L 33/22
USPC ............. 438/22, 28, 29, 31, 32; 257/74–103
See application file for complete search history.

(56) References Cited

U.S. PATENT DOCUMENTS

| 4,251,289 A | 2/1981 | Moustakas et al. |
| 4,285,762 A | 8/1981 | Moustakas |

(Continued)

FOREIGN PATENT DOCUMENTS

JP    2008192900 A  *  8/2008

OTHER PUBLICATIONS

Jmerik et al., "AlGaN-based Quantum-Well Heterostructures for Deep Ultraviolet Light-Emitting Diodes Grown by Submonolayer Discrete Plasma-assisted Molecular-Beam Epitaxy", Semiconductors, 2008, pp. 1420-1426, vol. 42, No. 12, Pleiades Publishing, Ltd.

*Primary Examiner* — Brook Kebede
(74) *Attorney, Agent, or Firm* — Richard T. Ogawa; Ogawa P.C.

(57) ABSTRACT

In the present invention, a fabrication process for epitaxy onto back-side patterned substrate, where the substrate patterns were defined prior to epitaxy and therefore simplify post growth processing. Specifically, for LED devices, said fabrication process reduces the post growth processing steps required to obtain high LEE due to strong scattering of the back-side features defined on the substrate. The features defined on the back-side patterned substrate scatters strongly with light emitted from the LED devices. Methods of obtaining such features include wet and dry etching.

21 Claims, 6 Drawing Sheets

(51) Int. Cl.
    *H01L 33/06* (2010.01)
    *H01L 33/32* (2010.01)
    *H01L 33/58* (2010.01)
    *H01L 33/20* (2010.01)

(56) References Cited

U.S. PATENT DOCUMENTS

| | | |
|---|---|---|
| 4,407,710 A | 10/1983 | Moustakas et al. |
| 4,417,092 A | 11/1983 | Moustakas et al. |
| 4,508,609 A | 4/1985 | Moustakas et al. |
| 4,528,082 A | 7/1985 | Moustakas et al. |
| 4,533,450 A | 8/1985 | Moustakas |
| 4,739,383 A | 4/1988 | Maruska et al. |
| 5,296,119 A | 3/1994 | Moustakas |
| 5,385,862 A | 1/1995 | Moustakas |
| 5,633,192 A | 5/1997 | Moustakas et al. |
| 5,677,538 A | 10/1997 | Moustakas et al. |
| 5,686,738 A | 11/1997 | Moustakas |
| 5,725,674 A | 3/1998 | Moustakas et al. |
| 5,847,397 A | 12/1998 | Moustakas |
| 6,123,768 A | 9/2000 | Moustakas |
| 6,275,137 B1 | 8/2001 | Doppalapudi et al. |
| 6,441,716 B1 | 8/2002 | Doppalapudi et al. |
| 6,953,703 B2 | 10/2005 | Moustakas |
| 7,235,819 B2 | 6/2007 | Moustakas |
| 7,413,958 B2 | 8/2008 | Gunter et al. |
| 7,498,182 B1 | 3/2009 | Sampath et al. |
| 7,663,157 B2 | 2/2010 | Moustakas et al. |
| 7,777,241 B2 | 8/2010 | Moustakas et al. |
| 8,035,113 B2 | 10/2011 | Moustakas et al. |
| RE42,955 E | 11/2011 | Gunter et al. |
| 8,237,175 B2 | 8/2012 | Moustakas et al. |
| 8,247,843 B2 | 8/2012 | Gunter et al. |
| 8,257,987 B2 | 9/2012 | Moustakas et al. |
| 8,592,800 B2 | 11/2013 | Moustakas et al. |
| 9,112,103 B1 * | 8/2015 | Liao .............. H01L 33/007 |
| 2005/0230701 A1 | 10/2005 | Huang |
| 2007/0075307 A1 | 4/2007 | Yoon et al. |
| 2008/0157102 A1 | 7/2008 | Hori et al. |
| 2009/0206320 A1 | 8/2009 | Chua et al. |
| 2009/0302308 A1 | 12/2009 | Chua et al. |
| 2010/0270532 A1 | 10/2010 | Takano et al. |
| 2012/0193672 A1 * | 8/2012 | Kim .............. H01L 33/0079 257/99 |

\* cited by examiner

FIGURE 2: A Specific Process for Substrate

BACKSIDE TRANSPARENT SUBSTRATE ROUGHENING FOR UV LIGHT EMITTING DIODE

CROSS-REFERENCE TO RELATED APPLICATIONS

This application is a continuation of Nonprovisional application Ser. No. 14/194,425, filed Feb. 28, 2014, which claims priority to U.S. Provisional Application No. 61/776,760, filed Mar. 11, 2013, commonly assigned, and hereby incorporated by reference herein.

BACKGROUND OF THE INVENTION

Light emitting diodes (LEDs) based on InAlGaN multiple quantum wells (MQWs) generally suffer from certain limitations in terms of energy efficiency to produce light. One limitation is to efficiently extract light generated in the MQWs from inside the LEDs to air. Due to the refractive index difference between the InAlGaN material and air, a majority of the photons generated inside the MQWs is usually trapped inside by total internal reflection (TIR) and cannot escape the LEDs. Such photons eventually are lost inside the LEDs due to intrinsic material losses and other absorption mechanisms.

There has been various ways being developed to improve light extraction efficiency (LEE) from a LED device. For LEDs grown on absorbing layers/substrates, window layers have been used to help extract light from side cones of a LED chip, and distributed Bragg reflectors (DBRs) have been applied to reflect light away from the absorbing layers. For LEDs grown on transparent substrates, roughening/texturing of the p-type layers has been used to improve light extraction for epi-side up structures. For flip-chip LEDs, post epi-growth processing is required, including substrate removal and roughening/texturing of the n-type layers (thin film flip-chip), or thinning down the substrate (for example, sapphire substrate) to less than 100 um. For vertical structure LEDs, after substrate removal, photonic crystals have been employed to pattern the n-type layers to achieve high LEE.

Despite significant advances achieved in improving the LEE, most of the existing approaches require post epi-growth processing which can be quite complex and potentially affects the yield, reliability and cost of the LEDs. A simple method that does not require extensive post-growth processing of the LED wafers, yet helps to improve LEE would be highly desirable, especially in the manufacturing environment.

Patterned sapphire substrate (PSS) has been well established as a substrate of choice for LED epitaxy. The epi growth proceeds by deposition of InAlGaN material onto a substrate with pre-defined features. Such features are usually defined onto the surface of the substrate by wet or dry etching, characterized by their height, width, length, diameter and/or pitches, and are usually periodic in nature. Thin film epitaxy, especially LEDs, onto such features will produce epi materials with reduced dislocation density and thus improvement in power output. Also, such features acts as scattering centers in the material, which improves the LEE of the LED by increasing the opportunity for light to escape from the InAlGaN into the substrate from multiple bounces.

BRIEF SUMMARY OF THE INVENTION

In the present invention, a fabrication process for epitaxy onto back-side patterned substrate, where the substrate patterns were defined prior to epitaxy and therefore simplify post growth processing. Specifically, for LED devices, said fabrication process reduces the post growth processing steps required to obtain high LEE due to strong scattering of the back-side features defined on the substrate. The features defined on the back-side patterned substrate scatters strongly with light emitted from the LED devices. Methods of obtaining such features include wet and dry etching.

In the present invention, we disclose a fabrication process for epitaxy onto back-side patterned substrates, where the substrate patterns were defined prior to epitaxy and therefore simplify post-growth processing. Unlike the PSS, where epi material is deposited onto the patterns formed on the front, epi-ready side of the substrate, no semiconductor material is being epitaxially grown onto the back-side patterns in this case. An example of this invention includes a process designed for UV-LEDs, where pre-defined features that scatter strongly with ultraviolet light are patterned onto the back-side of a substrate, and then introduced to a reactor for epitaxy to produce UV-LEDs with improved LEE.

In a specific embodiment, the present invention provides a method for fabricating an optical diode device configured to emit electromagnetic radiation in an ultraviolet range. The method includes providing a transparent substrate member having a growth surface and a backside surface, and treating the backside surface to a polishing process to remove contaminants from the backside surface. The method includes subjecting the backside surface to a treatment process to cause the backside surface to be characterized by a roughness having a periodic spatial pattern overlying the backside surface and forming a thickness of metal on the backside surface. The method includes transferring the transparent substrate member into a reactor chamber for deposition of epitaxial materials and forming a buffer material overlying the growth surface while exposing the backside surface. The method includes processing the substrate at a temperature greater than 100 degrees to less than 1,500 degrees, and removing the thickness of metal to expose the backside surface including the roughness having the periodic spatial pattern.

Various benefits are achieved over pre-existing techniques using the present invention. In particular, the present invention enables a cost-effective UV LED using conventional processes. Depending upon the embodiment, the present apparatus and method can be manufactured using conventional materials and/or methods according to one of ordinary skill in the art. Of course, there can be other variations, modifications, and alternatives. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

In the present invention, a fabrication process for epitaxy onto back-side patterned substrate, where the substrate patterns were defined prior to epitaxy and therefore simplify post growth processing. Specifically, for LED devices, said fabrication process reduces the post growth processing steps required to obtain high LEE due to strong scattering of the back-side features defined on the substrate. The features defined on the back-side patterned substrate scatters strongly with light emitted from the LED devices. Methods of obtaining such features include wet and dry etching.

In an example, the present invention is described below. A process of manufacturing UV-LEDs onto pre-defined, back-side patterned sapphire substrate is provided. In an example, the present process defines features on the back-side of sapphire substrate. "Back-side" refers to the opposite side of the sapphire substrate where the epi-layers will be grown onto. In an example, features that are going to be defined (patterned) onto the back-side of the sapphire substrate are obtained by a semiconductor fabrication process that includes, but not limit to: photolithography, nano-imprinting, wet etching and dry etching, or combinations thereof. The features patterned onto the substrate include, but not limited to: pyramids, hexagons, trenches, truncated pyramids, hemispherical lenses, trapezoids, etc., and other regular, irregular shapes, or combinations thereof. In an example, the size of the features is in the range of 10 nanometers to 100 microns. In this particular example, the back side of a (0001) sapphire substrate is patterned with features of the following characteristics:

a. Height—350 nm
b. Diameter—300 nm
c. Space—100 nm
d. Pitch—400 nm

Figure 1:
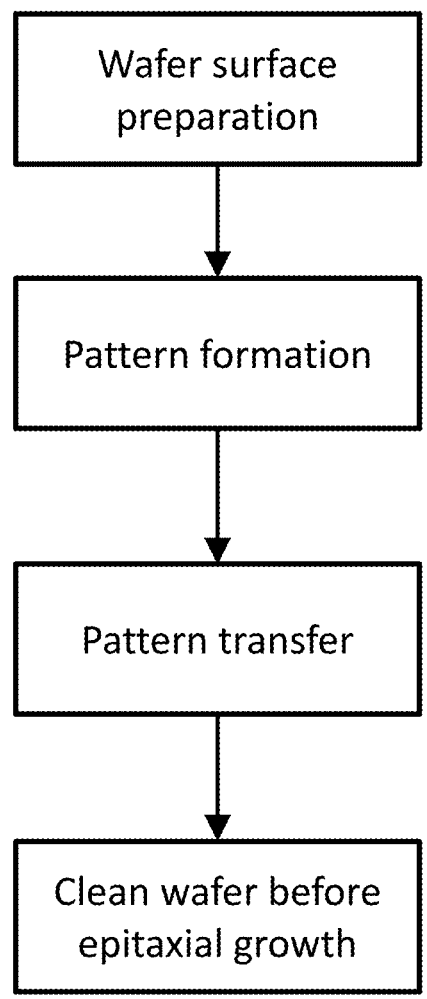
FIG. 1 is a simplified process flow diagram of a manufacture of a UV-LED device according to an example of the present invention.

Of course, there can be variations to the above characteristics. In an example, a general process for substrate backside pattern formation is provided. The general process flow includes wafer surface preparation, pattern formation, pattern transfer, and clean before epitaxial growth, among other process, as referring to FIG. 1. In an example, the wafer surface preparation is highly dependent on the details of the process. But generally involves cleaning the wafer to remove organic [solvents] and inorganic [caustics] residues. In an example, the process also may need to modify the surface chemistry for the subsequent process steps.

In an example, the present process also includes pattern formation. In an example, pattern formation can include, among others, photolithography, e-beam lithography, microprinting, ink jet printing, patterning of a sacrificial layer by ion milling, laser ablation or plasma torch, masking the surface with a layer of nanoparticles, combinations thereof, and the like. Of course, there can also be variations, modifications, and alternatives.

In an example, the present process also includes pattern transfer. In an example, the present process includes wet etching, plasma [dry] etching, direct substrate patterning by plasma torch, ion milling and/or laser ablation, combinations thereof, and the like. Of course, there can also be variations, modifications, and alternatives. Once the pattern is transferred, the process includes cleaning. The cleaning includes any removal of any residue caused by or left over from the patterning process. The cleaning can include both wet and dry techniques. Wet techniques include solvents, water, or other organics or surfactants. In an example, dry techniques include plasma treatment, and others.

Figure 2:
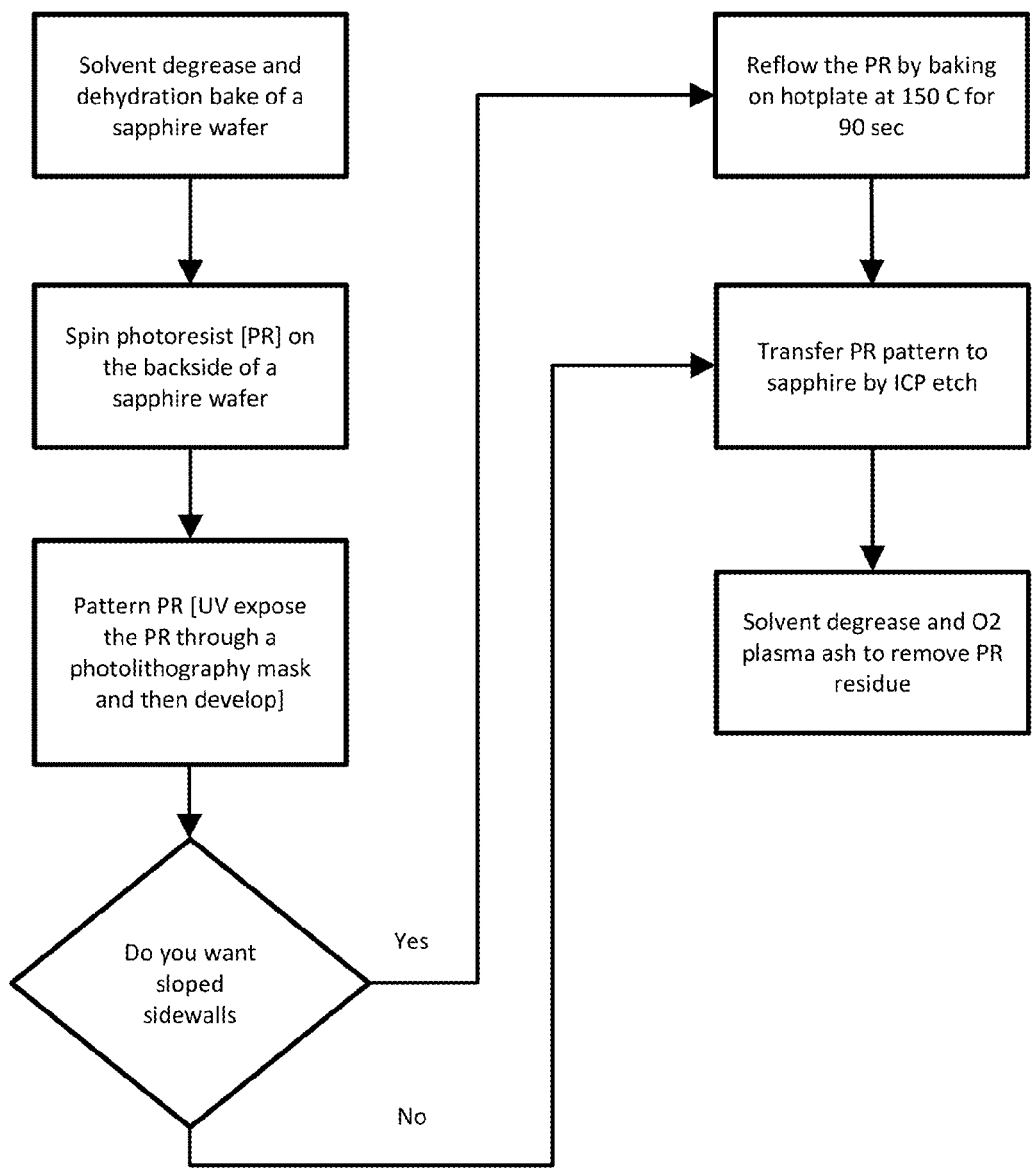
FIG. 2 is a more detailed process flow diagram of a backside roughening process for a UV-LED according to an example of the present invention.

Referring to FIG. 2, the present method includes a solvent degrease and dehydration bake of a sapphire wafer, as shown. In an example, the method includes spin photoresist [PR] on the backside of a sapphire wafer. Thereafter, the method includes pattern PR [UV expose the PR through a photolithography mask and then develop], or other process. In an example, the method determines whether sloped sidewalls are desired. If the method includes reflows the photoresist for a certain time and temperature. The method then transfer PR pattern to sapphire by an inductively coupled plasma (ICP) etch or other process. That is, the sapphire is patterned using an etching process. In an example, the method then removes the photoresist using a solvent degrease and oxygen bearing plasma ashing process. Of course, there can be other variations, modifications, and alternatives.

Figure 3:
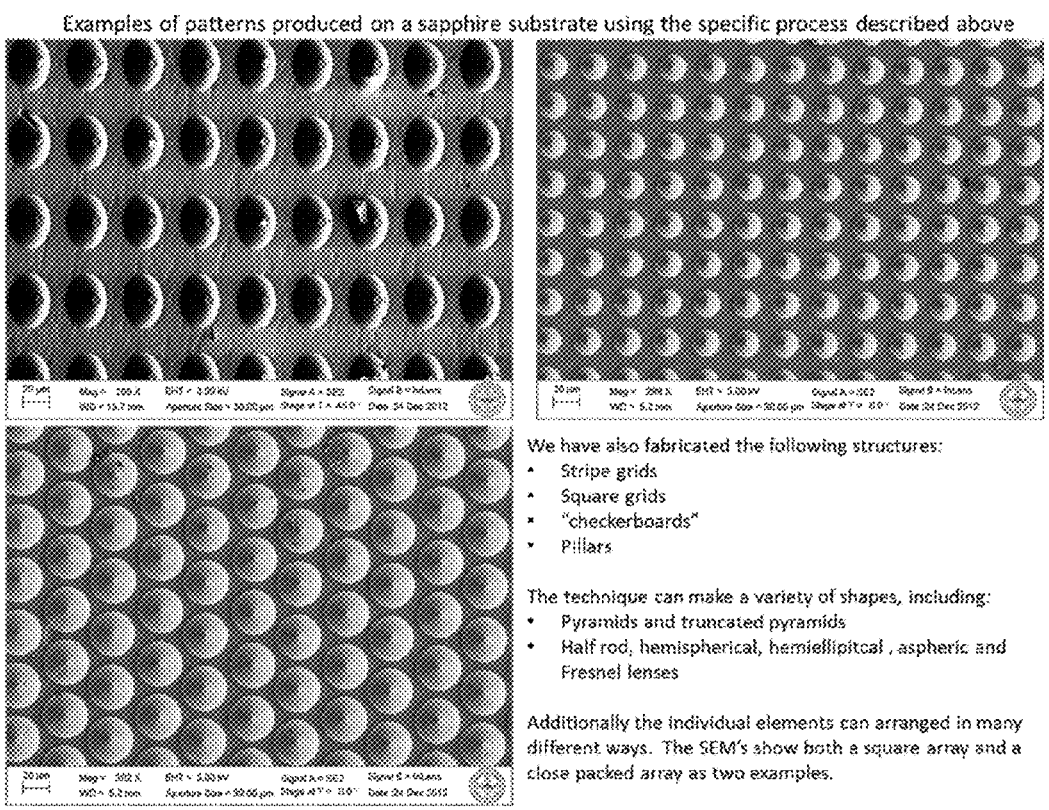
FIG. 3 are photographs of various backside-roughening examples according to various embodiments.

As shown in FIG. 3, illustrations include stripe grids, square grids, checkerboards, pillars, among other structures. In an example, the shapes include pyramids, truncated pyramids, half rods, hemispherical, hemi-elliptical, aspheric, and Fresnel lenses, combinations thereof, and the like. In an example, a close packed array is shown or a square array. In an example, other spatial configurations, which are regular or irregular or combinations thereof, can be included.

Figure 4:
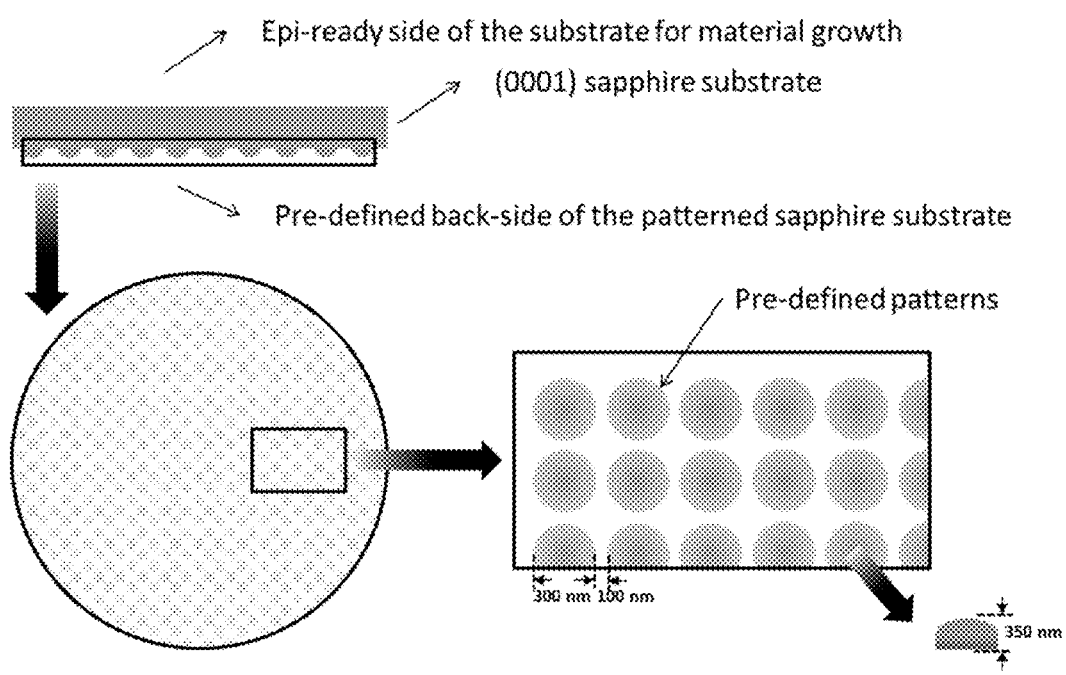
FIG. 4 illustrates a simplified process flow for backside roughing in an example of the present invention.

In an example in FIG. 4, the process includes transferring the substrate to a reactor and deposit InAlGaN epi-layers on the epi-ready side, opposite to the back-side with pre-defined patterns/features. In an example, the present invention provides a method for fabricating an optical diode device configured to emit electromagnetic radiation in an ultraviolet range. The method includes providing a transparent substrate member (e.g., sapphire) having a growth surface and a backside surface. In an example, the method includes treating the backside surface to a polishing process to remove contaminants from the backside surface and subjecting the backside surface to a treatment process to cause the backside surface to be characterized by a roughness having a periodic spatial pattern overlying the backside surface, as shown. The method includes forming a thickness of metal on the backside surface to cover the roughness. The method includes transferring the transparent substrate member into a reactor chamber for deposition of epitaxial materials to form active device regions. The method also includes forming a buffer material overlying the growth surface while exposing the backside surface before deposition of the active regions. In an example, the method processes the substrate at a temperature greater than 100 degrees to less than 1,500 degrees and removing the thickness of metal to expose the backside surface including the roughness having the periodic spatial pattern.

In an example, the substrate is a (0001) plane sapphire substrate and the front side of the substrate for epitaxial growth is the (0001) face. In an example, the back-side periodic pattern is of nanometer scale. In an example, the back-side periodic pattern is of micron scale.

In an example, the material epitaxially grown onto the back-side patterned substrate comprises indium aluminum gallium nitride (In$_x$Al$_y$Ga$_{1-x-y}$N, 0<x<1, 0<y<1). In an example, the material epitaxially grown onto the back-side patterned substrate comprises indium aluminum gallium nitride (InxAlyGa1-x-yN, 0<x<1, 0<y<1) doped with silicon or magnesium.

In an example, the back-side periodic pattern is formed by dry etching such as an ICP. In an example, the back-side periodic pattern is formed by wet etching. In an example, the back-side periodic pattern is formed by depositing a foreign material onto the back-side of the substrate. In an example, the foreign material deposited onto the back-side of the substrate consists of dielectrics. In an example, the foreign material deposited onto the back-side of the substrate consists of silicon nitride or silicon dioxide spheres of nanometer or micron scale. In an example, the front side of the substrate is free of periodic patterns.

Figure 5:
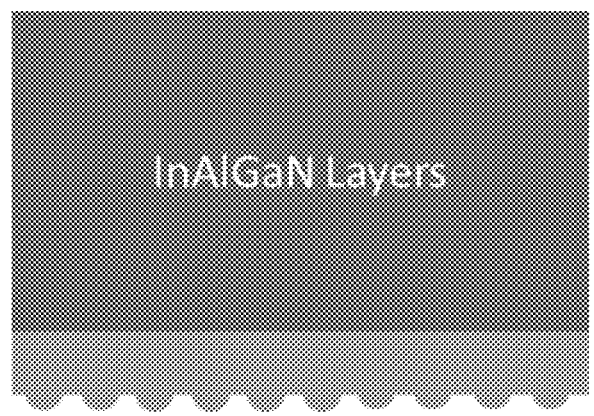
FIG. 5 is a simplified side-view diagram of a UV-LED in accordance to an example of the present invention.

In an example, the process includes use of standard LED fabrication technology (without roughening/texturing the back-side of the sapphire substrate) to produce LEDs using the epi-wafer produced by the prior process steps. In an example, the process includes formation of a buffer layer, a plurality of epitaxial materials for an active region (quantum well regions), a contact region, among others, as provided in FIG. 5. Of course, there can be other variations, modifications, and alternatives.

Figure 6:
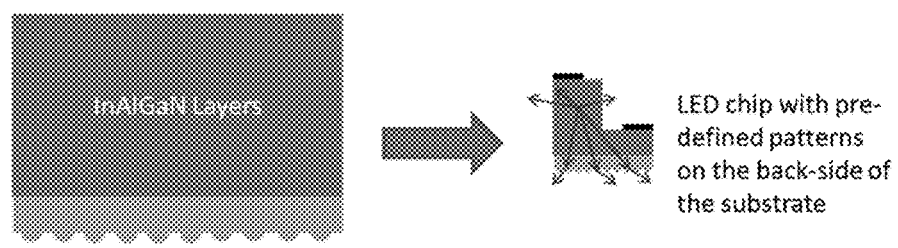
FIG. 6 is a simplified side-view diagram of a UV LED in accordance to an example of the present invention.

As shown in FIG. 6, the present method uses a predefined substrate with backside patterning, and subsequent formation of epitaxial material to form active regions, contacts, and others, for the manufacture of a gallium and nitrogen containing LED device. In an example, the device is configured to emit electromagnetic radiation in the ultra-violet range, and possibly others.

In an example, the present invention provides a semiconductor device configured to emit electromagnetic radiation in the ultraviolet light range grown onto a substrate, which has a front side surface configured for growth of a plurality of epitaxial materials, and a back-side surface configured for a plurality of periodic spatial patterns formed prior to growth of the plurality of epitaxial materials.

In an example, the semiconductor device comprises a quantum heterostructure of indium aluminum gallium nitride (InxAlyGa1-x-yN, 0<x<1, 0<y<1). In an example, the semiconductor device is a light emitting device. In an example, the plurality of epitaxial materials comprises essentially of indium aluminum gallium nitride (InxAlyGa1-x-yN, 0<x<1, 0<y<1) for a light emitting diode. In an example, the substrate is selected from a group of members, including polar and non-polar sapphire substrate, silicon, glass, quartz and native nitride substrates.

In an example, the plurality of epitaxial materials comprises a first layer grown onto the front side surface of the substrate, the first layer being comprised essentially of indium aluminum gallium nitride (InxAlyGa1-x-yN, 0<x<1, 0<y<1). In an example, the front side surface of the substrate is free of periodic patterns and is substantially smooth for formation of the plurality of epitaxial materials. In an example, the periodic spatial patterns is formed by dry etching, wet etching, or depositing a foreign material. In an example, the foreign material is selected from a dielectric material, a silicon nitride or silicon dioxide spheres of nanometer or micron scale. Of course, there can be other variations.

The present invention achieves these benefits and others in the context of known process technology. However, a further understanding of the nature and advantages of the present invention may be realized by reference to the latter portions of the specification and attached drawings.

What is claimed is:

1. A method for fabricating an optical diode device configured to emit electromagnetic radiation in an ultraviolet range, the method comprising:
   providing a transparent substrate member having a growth surface and a backside surface;
   treating the backside surface to a polishing process to remove contaminants from the backside surface;
   subjecting the backside surface to a treatment process to cause the backside surface to be characterized by a roughness having a periodic spatial pattern overlying the backside surface;
   forming a thickness of metal on the backside surface, the plurality of periodic spatial patterns being selected from one of a plurality of stripe grids, a plurality of square grids, a checker board, or other regular spatial configurations;
   transferring the transparent substrate member into a reactor chamber for deposition of epitaxial materials;
   forming a buffer material overlying the growth surface while exposing the backside surface;
   processing the substrate at a temperature greater than 100 degrees to less than 1,500 degrees;
   and
   removing the thickness of metal to expose the backside surface including the roughness having the periodic spatial pattern.

2. The method of claim 1, where the substrate is a (0001) plane sapphire substrate and the front side of the substrate for epitaxial growth is the (0001) face.

3. The method of claim 1, wherein the back-side periodic pattern is of nanometer scale.

4. The method of claim 1, wherein the back-side periodic pattern is of micron scale.

5. The method of claim 1, wherein the material epitaxially grown onto the back-side patterned substrate comprises indium aluminum gallium nitride (InxAlyGa1-x-yN, 0<x<1, 0<y<1).

6. The method of claim 1, wherein the material epitaxially grown onto the back-side patterned substrate comprises indium aluminum gallium nitride (InxAlyGa1-x-yN, 0<x<1, 0<y<1) doped with silicon or magnesium.

7. The method of claim 1, wherein the back-side periodic pattern is formed by dry etching.

8. The method of claim 1, wherein the back-side periodic pattern is formed by wet etching.

9. The method of claim 1, wherein the back-side periodic pattern is formed by depositing a foreign material onto the back-side of the substrate.

10. The method of claim 8, wherein the foreign material deposited onto the back-side of the substrate consists of dielectrics.

11. The method of claim 8, wherein the foreign material deposited onto the back-side of the substrate consists of silicon nitride or silicon dioxide spheres of nanometer or micron scale.

12. The method of claim 1, wherein the front side of the substrate is free of periodic patterns.

13. A semiconductor device configured to emit electromagnetic radiation in the ultraviolet light range grown onto a substrate, the substrate comprising a front side surface configured for growth of a plurality of epitaxial materials, and a back-side surface comprising a plurality of periodic spatial patterns formed prior to growth of the plurality of epitaxial materials, the plurality of periodic spatial patterns being selected from a group consisting of: a plurality of square grids, a checker board, and a close packed array.

14. The semiconductor device of claim 13, wherein the semiconductor device comprises a quantum heterostructure of indium aluminum gallium nitride (InxAlyGa1-x-yN, 0<x<1, 0<y<1).

15. The semiconductor device of claim 13,
wherein the semiconductor device is a light emitting device; and
wherein each of the spatial patterns being selected from a group consisting of: a hemisphere, a pyramid, a truncated pyramid, a hemielliptical, or an aspheric lens.

16. The semiconductor device of claim 13, wherein the plurality of epitaxial materials comprising essentially of indium aluminum gallium nitride (InxAlyGa1-x-yN, 0<x<1, 0<y<1) for a light emitting diode.

17. The semiconductor device of claim 13 wherein the substrate is selected from a group of members, including polar and non-polar sapphire substrate, silicon, glass, quartz and native nitride substrates.

18. The semiconductor device of claim 13, wherein the plurality of epitaxial materials comprises a first layer grown onto the front side surface of the substrate, the first layer being comprised essentially of indium aluminum gallium nitride (InxAlyGa1-x-yN, 0<x<1, 0<y<1).

19. The semiconductor device of claim 13, wherein the front side surface of the substrate is free of periodic patterns and is substantially smooth for formation of the plurality of epitaxial materials.

20. The semiconductor device of claim 13 wherein the periodic spatial patterns comprises a foreign material disposed upon the back-side surface.

21. The semiconductor device of claim 20 wherein foreign material is selected from a group consisting of: a dielectric material, a silicon nitride, and silicon dioxide spheres of nanometer or micron scale.

* * * * *